(12) United States Patent
Stong et al.

(10) Patent No.: US 10,030,773 B2
(45) Date of Patent: Jul. 24, 2018

(54) PISTON RING

(71) Applicant: MAHLE INTERNATIONAL GMBH, Stuttgart (DE)

(72) Inventors: Thomas Stong, Kent City, MI (US); Thomas Smith, Muskegon, MI (US)

(73) Assignee: MAHLE INTERNATIONAL GMBH, Stuttgart (DE)

( * ) Notice: Subject to any disclaimer, the term of this patent is extended or adjusted under 35 U.S.C. 154(b) by 119 days.

(21) Appl. No.: 15/061,181

(22) Filed: Mar. 4, 2016

(65) Prior Publication Data

US 2017/0254418 A1 Sep. 7, 2017

(51) Int. Cl.
*F16J 9/26* (2006.01)

(52) U.S. Cl.
CPC ....................... *F16J 9/26* (2013.01)

(58) Field of Classification Search
USPC ......... 277/434, 440, 442–444; 428/336, 468, 428/472, 697, 698, 699, 704, 469
See application file for complete search history.

(56) References Cited

U.S. PATENT DOCUMENTS

| | | |
|---|---|---|
| 4,974,498 A | 12/1990 | Lemelson |
| 5,154,433 A | 10/1992 | Naruse |
| 5,449,547 A | 9/1995 | Miyazaki et al. |
| 5,582,414 A | 12/1996 | Miyazaki et al. |
| 5,587,227 A | 12/1996 | Ooya |
| 5,618,590 A | 4/1997 | Naruse et al. |
| 5,718,437 A | 2/1998 | Tanaka et al. |
| 6,060,182 A | 5/2000 | Tanaka et al. |
| 6,139,984 A | 10/2000 | Onoda et al. |
| 6,161,837 A | 12/2000 | Shureb |
| 6,232,003 B1 | 5/2001 | Ogawa et al. |
| 6,235,415 B1 | 5/2001 | Ogawa et al. |
| 6,270,081 B2 | 8/2001 | Onoda et al. |
| 6,274,257 B1 | 8/2001 | Aharonov et al. |
| 6,325,385 B1 | 12/2001 | Iwashita et al. |
| 6,372,369 B1 | 4/2002 | Ito et al. |
| 6,494,461 B1 | 12/2002 | Ogawa et al. |
| 6,508,473 B1 | 1/2003 | Tanaka et al. |
| 6,553,957 B1 | 4/2003 | Ishikawa et al. |

(Continued)

FOREIGN PATENT DOCUMENTS

| | | |
|---|---|---|
| DE | 102008017583 B4 | 5/2012 |
| DE | 102006046917 C5 | 3/2014 |

(Continued)

OTHER PUBLICATIONS

Tsai et al "Structure and mechanical propoerties of (TiVCr)N coatings prepared by energetic bombardment sputtering with different flow ratios" Journal of Allys & Compounds 509 (2011) p. 3141-3147.*

(Continued)

*Primary Examiner* — Archene Turner
(74) *Attorney, Agent, or Firm* — Reising Ethington P.C.

(57) ABSTRACT

A piston ring for a piston of a reciprocating internal combustion engine. The piston ring comprises a body having an outer contact surface. A tribological coating is formed on the outer contact surface of the body. The tribological coating comprises a quaternary Cr—V—Ti—N system. In one form, the tribological coating is deposited on the outer contact surface of the body as a stack of multiple layers.

19 Claims, 2 Drawing Sheets

(56) References Cited

U.S. PATENT DOCUMENTS

| | | |
|---|---|---|
| 6,631,907 B1 | 10/2003 | Onoda et al. |
| 7,159,640 B2 | 1/2007 | Inoue et al. |
| 7,267,344 B2 | 9/2007 | Fischer et al. |
| 7,891,669 B2 | 2/2011 | Araujo et al. |
| 8,033,550 B2 | 10/2011 | Jacquet et al. |
| 8,080,324 B2 | 12/2011 | Yamamoto |
| 8,273,469 B2 | 9/2012 | Hoppe et al. |
| 8,597,797 B2 | 12/2013 | Sekiya et al. |
| 8,652,620 B2 | 2/2014 | Fischer et al. |
| 9,004,465 B2 | 4/2015 | Kennedy et al. |
| 9,057,442 B2 | 6/2015 | Lu |
| 2005/0170162 A1* | 8/2005 | Yamamoto .......... C23C 14/0036 428/332 |
| 2006/0269790 A1 | 11/2006 | Sarabanda et al. |
| 2008/0007006 A1 | 1/2008 | Kawai |
| 2008/0095939 A1 | 4/2008 | Fischer et al. |
| 2008/0136116 A1 | 6/2008 | Sarabanda et al. |
| 2008/0261058 A1* | 10/2008 | Layyous .......... C23C 30/005 428/450 |
| 2009/0068478 A1* | 3/2009 | Yamamoto .......... C23C 14/0635 428/698 |
| 2009/0317659 A1* | 12/2009 | Yamamoto .......... C23C 14/022 428/655 |
| 2010/0044968 A1 | 2/2010 | Fischer et al. |
| 2010/0044969 A1 | 2/2010 | Fischer et al. |
| 2010/0047545 A1* | 2/2010 | Yamamoto .......... C23C 14/06 428/220 |
| 2010/0171272 A1 | 7/2010 | Hoppe et al. |
| 2010/0187765 A1 | 7/2010 | Hoppe et al. |
| 2011/0101621 A1 | 5/2011 | Kennedy et al. |
| 2011/0148047 A1 | 6/2011 | Araujo |
| 2012/0088093 A1 | 4/2012 | Kennedy |
| 2012/0126488 A1 | 5/2012 | Araujo |
| 2013/0004756 A1 | 1/2013 | Kennedy et al. |
| 2013/0042845 A1 | 2/2013 | Kennedy et al. |
| 2013/0075977 A1 | 3/2013 | An |
| 2013/0200572 A1 | 8/2013 | Cha et al. |
| 2013/0214493 A1 | 8/2013 | Cha et al. |
| 2013/0221621 A1 | 8/2013 | Araujo |
| 2013/0241154 A1 | 9/2013 | Shim et al. |
| 2014/0102599 A1 | 4/2014 | Aharonov et al. |
| 2014/0137831 A1 | 5/2014 | Datta et al. |
| 2014/0217677 A1 | 8/2014 | Smith et al. |
| 2014/0234582 A1 | 8/2014 | Honda et al. |
| 2014/0245987 A1 | 9/2014 | Da Rocha Mordente et al. |
| 2014/0284882 A1 | 9/2014 | Zinnabold et al. |
| 2014/0353923 A1 | 12/2014 | Lammers et al. |
| 2015/0018254 A1 | 1/2015 | Araujo et al. |

FOREIGN PATENT DOCUMENTS

| | | |
|---|---|---|
| DE | 102012217918 A1 | 4/2014 |
| EP | 2297373 B1 | 8/2013 |
| GB | 2296257 A | 6/1996 |
| JP | S62120471 A | 6/1987 |
| JP | 01006514 A | 1/1989 |
| JP | H06330348 A | 11/1994 |
| JP | 2000144376 * | 5/2000 |
| JP | 2001335878 A | 12/2001 |
| JP | 2002256967 A | 9/2002 |
| JP | 2005061389 A | 3/2005 |
| WO | 2008040694 A3 | 4/2008 |
| WO | 2009155677 A1 | 12/2009 |
| WO | 2014088096 A1 | 6/2014 |
| WO | 2015023002 A1 | 2/2015 |
| WO | 2015082538 A1 | 6/2015 |

OTHER PUBLICATIONS

L. Rapoport, et al., High Temperature Friction Behavior of CrVxN Coatings, Surface & Coatings Technology 238 (2014) 207-215, Elsevier.

\* cited by examiner

PISTON RING

TECHNICAL FIELD

The present invention generally relates to a piston ring for a piston of a reciprocating engine, and more particularly, to a coating for a piston ring.

BACKGROUND

A piston ring is an open-ended ring that fits into an annular groove in an outer circumference of a piston of a reciprocating engine, such as an internal combustion engine. When disposed within a cylinder of the engine, the piston ring is compressed around the piston and the intrinsic spring force of the ring ensures sufficient contact between an outer circumferential surface of the ring and an inner wall of the cylinder. During engine operation, the piston moves up and down within the cylinder and the pressure exerted on the cylinder wall by the piston ring provides a seal around the piston between the combustion chamber and the crankcase, which helps prevent escape of combustion gases from the combustion chamber and helps control oil consumption. Piston rings also may help transfer heat away from the piston to the cylinder wall and may be configured to regulate the amount of oil on the cylinder wall by distributing it on and wiping it off the cylinder wall.

Metallic and/or ceramic coatings may be applied to contact surfaces of various sliding components to improve the tribological properties thereof. For example, chromium platings are commonly applied to the outer circumferential surfaces of piston rings for increased wear resistance. Graphite, phosphate, or molybdenum coatings may be used to reduce the sliding friction between an outer contact surface of a piston ring and an interior surface of a cylinder wall.

SUMMARY

According to an aspect of the invention, there is provided a piston ring comprising a body having an outer contact surface. A tribological coating is formed on the outer contact surface of the body. The tribological coating comprises a quaternary Cr—V—Ti—N system.

In accordance with an embodiment of the invention, the quaternary Cr—V—Ti—N system comprises 15-45 at % chromium (Cr), 10-20 at % vanadium (V), 5-15 at % titanium (Ti), and 40-50 at % nitrogen (N).

In accordance with an embodiment of the invention, a nitrided layer is formed at an exterior surface of the body of the piston ring, with the tribological coating formed over the nitrided layer.

In accordance with an embodiment of the invention, an intermediate coating is disposed between the body of the piston ring and the tribological coating.

In accordance with an embodiment of the invention, the tribological coating comprises a stack of multiple layers.

The piston ring, as described above, may be used in combination with a piston and disposed within a cylinder of a reciprocating internal combustion engine to form a seal around the piston between the combustion chamber and the crankcase. The piston ring, as described above, is generally more robust than prior art piston rings due to the presence of the tribological coating on the contact surface of the piston ring. In particular, the presence of the tribological coating on the contact surface of the piston ring may provide the piston ring with enhanced wear resistance, scuff resistance, high hardness, and low friction properties, which may allow the piston ring to more effectively and efficiently function in the relatively harsh operating environments of modern combustion engines and also may increase the service life of the piston ring.

BRIEF DESCRIPTION OF THE DRAWINGS

Preferred exemplary embodiments of the invention will hereinafter be described in conjunction with the appended drawings, wherein like designations denote like elements, and wherein.

DETAILED DESCRIPTION

The presently disclosed tribological coating may be formed on a contact surface of a sliding component, such as a piston ring for a piston of a reciprocating internal combustion engine. When the tribological coating is formed on an outer circumferential surface of a piston ring, such as an upper compression ring, the tribological coating may provide the piston ring with certain desirable properties. For example, the presently disclosed tribological coating may be formulated to enhance the wear resistance, scuff resistance, and hardness of the piston ring, while reducing sliding friction between the piston ring and the inner wall of the cylinder, which may allow the piston ring to better withstand the relatively harsh operating environments of modern combustion engines. In addition, the formulation of the tribological coating may provide the coating with improved ductility and a reduced amount of internal stress at high temperatures, as compared to conventional piston ring coatings, which may help reduce cracking and spalling of the coating.

Figure 1:
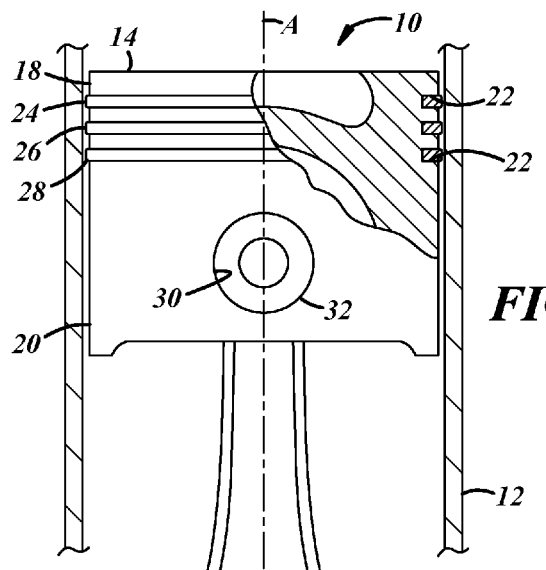
FIG. 1 is a side elevation of a piston and connecting rod assembly for an internal combustion engine.

FIG. 1 illustrates a piston and connecting rod assembly 10 for use in a cylinder 12 of a reciprocating internal combustion engine (not shown). The assembly 10 has a central longitudinal axis A and comprises a piston 14 and a connecting rod 16. The piston 14 has a body including an upper crown 18 and a lower skirt 20. A plurality of annular grooves 22 are formed about an outer circumference of the crown 18 of the piston 14 and are sized to accommodate three piston rings: an upper compression ring 24, a lower compression ring 26, and an oil control ring 28. Each of the piston rings 24, 26, 28 has an outer circumferential surface or contact surface that is adapted to contact and slide along an inner wall of the cylinder 12. A pin bore 30 is formed in the skirt 20 of the piston 14 and is sized to receive a piston pin 32 for connecting the piston 14 to a small end of the connecting rod 16.

Figure 2:
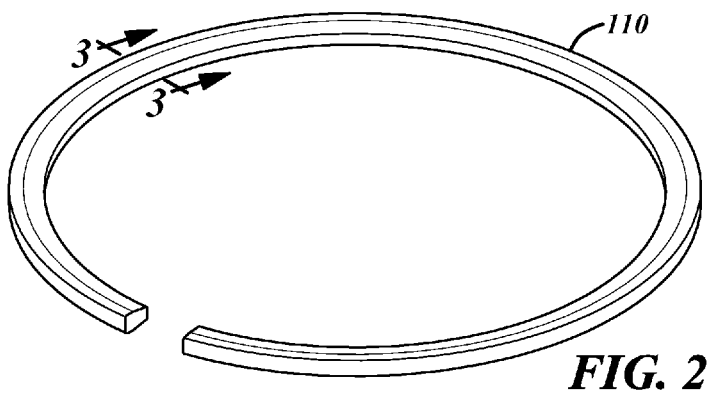
FIG. 2 is a perspective view of a piston ring.
Figure 3:
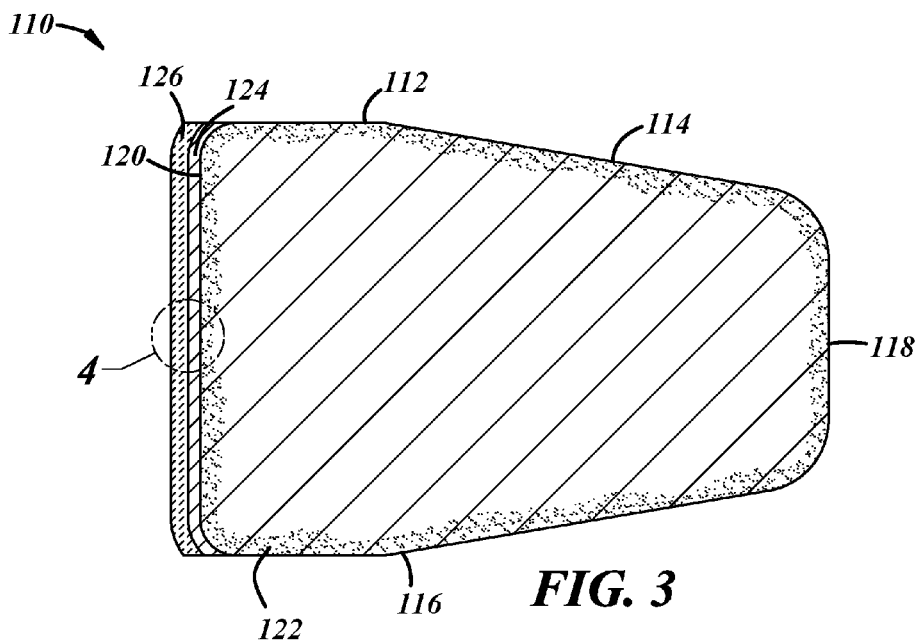
FIG. 3 is a cross-sectional view of the piston ring of FIG. 2 taken along line 3-3.

FIGS. 2 and 3 illustrate a piston ring 110 for a piston of a reciprocating internal combustion engine, such as the piston 14 illustrated in FIG. 1. The piston ring 110 comprises a split annular body 112 having an exterior surface that includes an upper surface 114, a lower surface 116, an inner circumferential surface 118, and an outer circumferential surface or contact surface 120 extending between the upper and lower surfaces 114, 116. The piston ring 110 illustrated in FIGS. 2 and 3 has a keystone or trapezoidal shaped cross-section, with tapered upper and lower surfaces 114, 116. However, in other embodiments, the piston ring 110 may exhibit various other cross-sectional shapes, e.g., rectangular. The annular body 112 may be made of cast iron (e.g., gray or nodular cast iron), steel (e.g., stainless steel), or any other suitable ferrous metal or alloy.

A diffusion nitrided layer 122 may be formed at the exterior surface of the annular body 112, although this is not necessarily required. The nitrided layer 122 may be formed by any known nitriding process. For example, the nitrided layer 122 may be formed by heating the annular body 112 to a suitable temperature and exposing the annular body 112 to a nitrogen-containing gas, e.g., ammonia ($NH_3$). The nitrided layer 122 may extend from the exterior surface of the annular body 112 of the piston ring 110 at a depth in the range of 10-170 µm. The actual depth of the nitrided layer 122 at the exterior surface of the body 112 may be selected based upon the size of the piston ring 110 and also may be selected to impart certain desirable mechanical and/or physical properties to the piston ring 110, including high hardness, wear resistance, scuff resistance, and improved fatigue life. In other embodiments, the exterior surface of the annular body 112 may be subjected to a different type of thermochemical surface treatment process to produce a different type of diffusion layer at the exterior surface of the annular body 112.

Referring now to FIG. 3, in one form, an intermediate coating 124 and a tribological coating 126 are formed on the exterior surface of the annular body 112 over the nitrided layer 122. The tribological coating 126 may be formed on the exterior surface of the annular body 112 over the intermediate coating 124 and/or over one or more other coating layers already present on the exterior surface of the annular body 112. Or the tribological coating 126 may be formed directly on the exterior surface of the annular body 112. In such case, the intermediate coating 124 is omitted. Forming the tribological coating 126 directly on the exterior surface of the annular body 112 may or may not include forming the tribological coating 126 over the nitrided layer 122 or some other type of diffusion layer. This will depend upon whether the annular body 112 has or has not been subjected to a nitriding process or some other type of thermochemical surface treatment process prior to deposition of the tribological coating 126.

In the embodiment illustrated in FIG. 3, the intermediate coating 124 and the tribological coating 126 are formed on the outer circumferential surface 120 of the annular body 112. In particular, the intermediate coating 124 and the tribological coating 126 are formed on the outer circumferential surface 120 of the annular body 112 such that the intermediate coating 124 and the tribological coating 126 both extend from the upper surface 114 to the lower surface 116 of the annular body 112. In other embodiments, the intermediate coating 124 and/or the tribological coating 126 may be additionally or alternatively formed over one or more other exterior surfaces of the annular body 112, including the upper surface 114, the lower surface 116, and/or the inner circumferential surface 118 of the body 112. In addition, in the embodiment illustrated in FIG. 3, the intermediate coating 124 is disposed between the nitrided layer 122 and the tribological coating 126 on the outer circumferential surface 120 of the annular body 112. However, in other embodiments, the intermediate coating 124 may be omitted and the tribological coating 126 may be formed directly on the outer circumferential surface 120 of the annular body 112.

The intermediate coating 124 may help improve adhesion of the tribological coating 126 to the exterior surface of the annular body 112 and may comprise at least one of chromium (Cr), nickel (Ni), cobalt (Co), titanium (Ti), and vanadium (V). For example, in some embodiments, the intermediate coating 124 may comprise a combination of chromium (Cr), titanium (Ti), and vanadium (V). In other embodiments, the intermediate coating 124 may consist essentially of elemental chromium (Cr). The intermediate coating 124 may be formed on the exterior surface of the annular body 112 by a thermal spray process (e.g., a flame spraying process, a high velocity oxy-fuel (HVOF) process, or a plasma spraying process), a physical vapor deposition (PVD) process, or by any other suitable process. A suitable thickness for the intermediate coating 124 may be in the range of 1-10 µm. However, in other forms, the thickness of the intermediate coating 124 may be somewhat more or less than this amount depending on the application method used to form the intermediate coating 124 on the exterior surface of the annular body 112.

The tribological coating 126 may improve the wear resistance, scuff resistance, hardness, and frictional properties of the piston ring 110 and may comprise a quaternary chromium (Cr), vanadium (V), titanium (Ti), and nitrogen (Ni)-containing system (Cr—V—Ti—N system). The amount of chromium (Cr) in the quaternary Cr—V—Ti—N system, as a percentage of the total number of atoms in the system, may be: greater than or equal to 15.0 at %, 25.0 at %, or 30.0 at %; less than or equal to 45.0 at %, 40.0 at %, or 35.0 at %; or between 15.0-45.0 at %, 25.0-40.0 at %, or 30.0-35.0 at %. The amount of vanadium (V) in the quaternary Cr—V—Ti—N system, as a percentage of the total number of atoms in the system, may be: greater than or equal to 5.0 at %, 10.0 at %, or 13.0 at %; less than or equal to 20.0 at %, 15.0 at %, or 13.0 at %; or between 5.0-20.0 at %, 10.0-15.0 at %, or 12.0-13.0 at %. The presence of vanadium (V) in the quaternary Cr—V—Ti—N system may help lower the frictional properties and increase the scuff resistance of the tribological coating 126. The amount of titanium (Ti) in the quaternary Cr—V—Ti—N system, as a percentage of the total number of atoms in the system, may be: greater than or equal to 0.0 at %, 5.0 at %, or 6.0 at %; less than or equal to 15.0 at %, 10.0 at %, or 8.0 at %; or between 0.0-15.0 at %, 5.0-10.0 at %, or 6.0-8.0 at %. In particular, the presence of about 5.0-15.0 at % titanium (Ti) in the quaternary Cr—V—Ti—N system may effectively enhance the hardness and wear resistance of the tribological coating 126 without adversely affecting other desirable properties of the coating 126 including internal stress. The amount of nitrogen (N) in the quaternary Cr—V—Ti—N system, as a percentage of the total number of atoms in the system, may be: greater than or equal to 40.0 at %, 42.5 at %, or 45.0 at %; less than or equal to 50.0 at %, 47.5 at %, or 47.0 at %; or between 40.0-50.0 at %, 42.5-47.5 at %, or 45.0-47.0 at %. In one specific embodiment, the tribological coating 126 may comprise about 34.5 at % chromium (Cr), 12.5 at % vanadium (V), about 7.0 at % titanium (Ti), and about 46.0 at % nitrogen (N).

The Cr:V:Ti atomic ratio in the quaternary Cr—V—Ti—N system may be about 5:2:1. For example, the Cr:V:Ti atomic ratio in the quaternary Cr—V—Ti—N system may be in the range of 4-6:1-3:0-2. The Cr:V atomic ratio in the quaternary Cr—V—Ti—N system may be about 3:1. For example, the Cr:V atomic ratio in the quaternary Cr—V—Ti—N system may be in the range of 1.5-4.5:1. The Cr:Ti atomic ratio in the quaternary Cr—V—Ti—N system may be about 5:1. For example, the Cr:Ti atomic ratio in the quaternary Cr—V—Ti—N system may be in the range of 4-6:1. The V:Ti atomic ratio in the quaternary Cr—V—

Ti—N system may be about 2:1. For example, the V:Ti atomic ratio in the quaternary Cr—V—Ti—N system may be in the range of 1-3:1.

The quaternary Cr—V—Ti—N system may be doped with one or more doping elements. For example, the quaternary Cr—V—Ti—N system may be doped with at least one of oxygen (O), carbon (C), and boron (B). The amount of the one or more doping elements in the quaternary Cr—V—Ti—N system, as a percentage of the total number of atoms in the system, may be: greater than or equal to 0.1 at %, 0.5 at %, or 2 at %; less than or equal to 10 at %, 8 at %, or 3 at %; or between 0.1-10 at %, 2-8 at %, or 0.5-3 at %. In some forms, the amount of oxygen (O), carbon (C), and/or boron (B) doping of the quaternary Cr—V—Ti—N system may be somewhat greater than 10 at % depending on the application of use and/or the desired characteristics of the tribological coating 126.

The tribological coating 126 may additionally include one or more elements or compounds of molybdenum (Mo), niobium (Nb), zirconium (Zr), tungsten (W), tantalum (Ta), aluminum (Al), and silicon (Si). For example, the tribological coating 126 may include one or more nitrides of molybdenum (Mo), niobium (Nb), zirconium (Zr), tungsten (W), tantalum (Ta), aluminum (Al), and silicon (Si). Such elements and/or compounds may be present in the tribological coating 126 in an amount greater than or equal to 0.0 at %, 5.0 at %, or 6.0 at %; less than or equal to 15.0 at %, 10.0 at %, or 8.0 at %; or between 0.0-15.0 at %, 5.0-10.0 at %, or 6.0-8.0 at %.

In one form, the tribological coating 126 may consist essentially of a quaternary chromium (Cr), vanadium (V), titanium (Ti), and nitrogen (Ni)-containing system (Cr—V—Ti—N system). For example, the quaternary Cr—V—Ti—N system may account for greater than or equal to 90 at %, greater than or equal to 95 at %, greater than or equal to 99 at %, greater than or equal to 99.9 at % of the tribological coating 126.

The tribological coating 126 may be formed on the exterior surface of the annular body 112 via any suitable physical vapor deposition (PVD) process (e.g., cathodic arc or sputtering), reactive electric arc process, or chemical vapor deposition (CVD) process. The tribological coating 126 may have an overall thickness in the range of about 5-100 µm. For example, in one form, the overall thickness of the tribological coating 126 may be in the range of about 20-40 µm. The overall thickness of the tribological coating 126 may be somewhat more or less than this amount depending on the particular application of use.

The tribological coating 126 may be deposited on the exterior surface of the annular body 112 as a single layer or as a stack of multiple successively applied layers, wherein the number of layers in the stack can be any integer greater than one. Forming the tribological coating 126 as a stack of multiple layers may provide the coating 126 with certain desirable attributes. For example, depositing the tribological coating 126 on the exterior surface of the annular body 112 as a stack of multiple layers may help reduce the overall internal stress of the tribological coating 126, which may help reduce the incidence of spalling. In addition, the composition of the layers in the stack of multiple layers may be formulated to allow for the formation of a relatively thick tribological coating 126 without creating an undue amount of internal stress within the coating 126.

In embodiments where the tribological coating 126 comprises a stack of multiple layers, each individual layer in the stack may have a generally uniform thickness and a generally uniform chemical composition. But the thickness and/or the chemical composition of each of the individual layers may be the same or different from that of the one or more other layers in the stack. In one form, the thickness of each of the individual layers in the stack of multiple layers that make up the tribological coating 126 may be in the range of 5-200 nm. The stack of multiple layers that make up the tribological coating 126 may comprise a quaternary Cr—V—Ti—N system. This may mean that the overall chemical composition of the stack of multiple layers comprises a quaternary Cr—V—Ti—N system when the composition of each of the individual layers is grouped together as a whole. Or, this may mean that one or more of the individual layers in the stack of multiple layers comprises a quaternary Cr—V—Ti—N system. In some forms, it may be desirable for a Cr—V—Ti—N-containing layer to form the outermost layer in the stack of multiple layers that make up the tribological coating 126.

In one form, the tribological coating 126 may comprise a stack of multiple layers that includes two, three, four, or more individual layers, with each of the individual layers having a different chemical composition than the others. In another form, the tribological coating 126 may comprise a stack of multiple layers wherein two or more of the individual layers have the same chemical composition, but at least one of the other individual layers has a different chemical composition. For example, the tribological coating 126 may comprise a stack of multiple layers that includes a series of two alternately and repeatedly applied individual layers having different chemical compositions. As another example, the tribological coating 126 may comprise a stack of multiple layers that includes a series of three or more sequentially and repeatedly applied layers, with each of the layers in the series having a different chemical composition.

Figure 4:
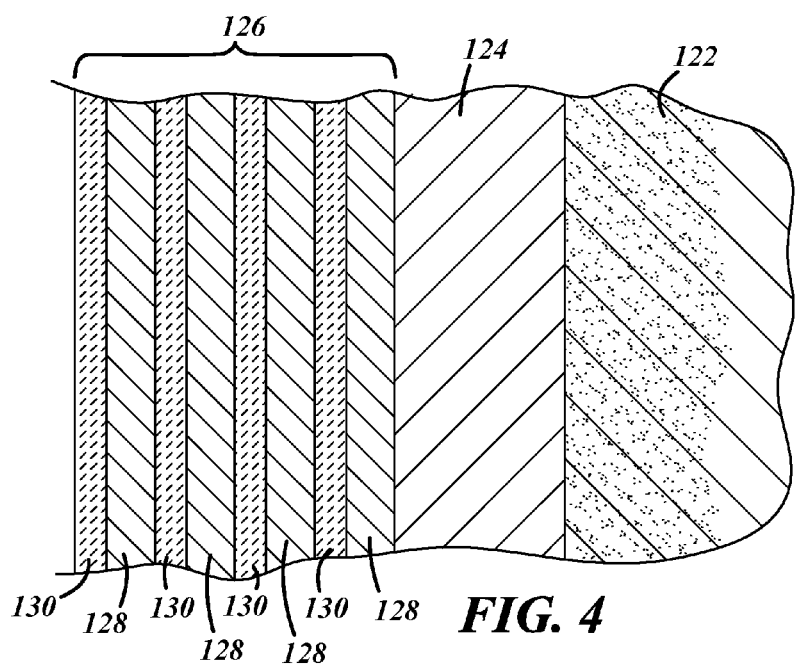
FIG. 4 is a magnified partial cross-sectional view of the piston ring.

Referring now to FIG. 4, in one form, the tribological coating 126 comprises a stack of multiple layers that includes a first layer 128 and a subsequently applied second layer 130. The tribological coating 126 is formed by alternately and repeatedly applying the first layer 128 and the second layer 130 to the exterior surface of the annular body 112. For example, the first and second layers 128, 130 may be alternately and repeatedly applied to the exterior surface of the annular body 112 a sufficient number of times for the tribological coating 126 to reach a final desired thickness. This may mean that each of the first and second layers 128, 130 is individually applied to the exterior surface of the annular body 112 two, three, four, or more times. The thickness of the first layer 128 may be the same or different from that of the second layer 130. In one form, the first layer 128 may have a thickness in the range of 5-150 nm and the second layer 130 may have a thickness in the range of 5-150 nm, with the thickness of the first layer 128 being different from that of the second layer 130. In one form, the chemical composition of the first layer 128 is different from that of the second layer 130. For example, the first layer 128 may comprise a quaternary Cr—V—Ti—N system and the second layer 130 may comprise one or more other metal nitrides, for example, binary metal nitrides. As another example, the first layer 128 may comprise one or more metal nitrides, for example, binary metal nitrides, and the second layer 130 may comprise a quaternary Cr—V—Ti—N system. Some examples of suitable metal nitrides for the first and second layers 128, 130 include chromium nitride (CrN and/or $Cr_2N$), vanadium nitride (VN), and/or titanium nitride (TiN). The first layer 128 and/or the second layer 130 also may include one or more elements or compounds of molybdenum (Mo), niobium (Nb), zirconium (Zr), tungsten (W), tantalum (Ta), aluminum (Al), and silicon (Si).

In one form, each layer in the stack of multiple layers that make up the tribological coating 126 may comprise a quaternary Cr—V—Ti—N system. In such case, the overall chemical composition of the tribological coating 126 may be generally uniform and may be the same regardless of whether the coating 126 is deposited as a single layer or in multiple layers on the exterior surface of the annular body 112.

It is to be understood that the foregoing is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "e.g.," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. A piston ring comprising:
   a body having an outer contact surface; and
   a tribological coating overlying the outer contact surface of the body, wherein the tribological coating comprises a quaternary Cr—V—Ti—N system,
   wherein an amount of chromium (Cr) in the quaternary Cr—V—Ti—N system is greater than or equal to 15.0 at % and less than or equal to 35.0 at %, an amount of vanadium (V) in the quaternary Cr—V—Ti—N system is greater than or equal to 5.0 at % and less than or equal to 13.0 at %, an amount of titanium (Ti) in the quaternary Cr—V—Ti—N system is greater than or equal to 5.0 at % and less than or equal to 8.0 at %, and an amount of nitrogen (N) in the quaternary Cr—V—Ti—N system is greater than or equal to 40.0 at % and less than or equal to 50.0 at %, and
   wherein an atomic ratio of Cr:V in the quaternary Cr—V—Ti—N system is in the range of 1.54.5:1 and an atomic ratio of Cr:Ti in the quaternary Cr—V—Ti—N system is in the range of 4-6:1.

2. The piston ring set forth in claim 1 wherein the tribological coating is doped with 0.1-10 at % of at least one doping element selected from the group consisting of oxygen (O), carbon (C), and boron (B).

3. The piston ring set forth in claim 1 wherein the tribological coating comprises 5-15 at % of at least one element or compound selected from the group consisting of molybdenum (Mo), niobium (Nb), zirconium (Zr), tungsten (W), and tantalum (Ta).

4. The piston ring set forth in claim 1 comprising:
   a diffusion nitrided layer formed at an exterior surface of the body, wherein the tribological coating is formed over the nitrided layer.

5. The piston ring set forth in claim 1 comprising:
   an intermediate coating disposed between the body and the tribological coating, wherein the intermediate coating comprises chromium (Cr), titanium (Ti), and vanadium (V).

6. The piston ring set forth in claim 1 wherein the tribological coating is formed on the outer contact surface of the body by a physical vapor deposition (PVD) process.

7. The piston ring set forth in claim 1 wherein the body comprises a split annular body and the tribological coating is formed on an outer circumferential surface of the annular body.

8. The piston ring set forth in claim 1 wherein the tribological coating has a thickness in the range of 5-100 µm.

9. The piston ring set forth in claim 1 wherein the tribological coating comprises a stack of multiple layers that includes a first layer and a second layer, with the first layer having a different chemical composition than that of the second layer.

10. The piston ring set forth in claim 9 wherein at least one of the layers in the stack of multiple layers that make up the tribological coating comprises a quaternary Cr—V—Ti—N system.

11. The piston ring set forth in claim 9 wherein at least one of the layers in the stack of multiple layers that make up the tribological coating comprises a binary metal nitride.

12. A piston ring comprising:
   a split annular body having an upper surface, a lower surface, an inner circumferential surface, and an outer circumferential surface extending between the upper and lower surfaces; and
   a tribological coating overlying the outer circumferential surface of the annular body, wherein the tribological coating is formed on the outer circumferential surface of the annular body as a stack of multiple layers,
   wherein the stack of multiple layers includes a first layer and a second layer, with the first layer having a different chemical composition than that of the second layer,
   wherein the first layer and the second layer are individually and alternately applied to the outer circumferential surface of the annular body at least two times,
   wherein the first layer comprises a quaternary Cr—V—Ti—N system, and
   wherein an amount of chromium (Cr) in the quaternary Cr—V—Ti—N system is greater than or equal to 15.0 at % and less than or equal to 35.0 at %, an amount of vanadium (V) in the quaternary Cr—V—Ti—N system is greater than or equal to 5.0 at % and less than or equal to 13.0 at %, an amount of titanium (Ti) in the quaternary Cr—V—Ti—N system is greater than or equal to 5.0 at % and less than or equal to 8.0 at %, and an amount of nitrogen (N) in the quaternary Cr—V—Ti—N system is greater than or equal to 40.0 at % and less than or equal to 50.0 at %, and wherein an atomic ratio of Cr:V in the quaternary Cr—V—Ti—N system is in the range of 1.5-4.5:1 and an atomic ratio of Cr:Ti in the quaternary Cr—V—Ti—N system is in the range of 4-6:1.

13. The piston ring set forth in claim 12 wherein the second layer comprises at least one binary metal nitride selected from the group consisting of chromium nitride, vanadium nitride, and titanium nitride.

14. The piston ring set forth in claim 12 comprising:
   a diffusion nitrided layer formed at an exterior surface of the annular body; and
   an intermediate coating formed on the outer circumferential surface of the annular body over the nitrided layer, wherein the tribological coating is formed over the intermediate coating on the outer circumferential surface of the annular body.

15. The piston ring set forth in claim 14 wherein the intermediate coating comprises chromium (Cr), titanium (Ti), and vanadium (V).

16. The piston ring set forth in claim 12 wherein the quaternary Cr—V—Ti—N system is doped with 0.1-10 at % of at least one doping element selected from the group consisting of oxygen (O), carbon (C), and boron (B).

17. The piston ring set forth in claim 12 wherein the first layer comprises an outermost layer in the stack of multiple layers.

18. The piston ring set forth in claim 12 wherein the first layer has a thickness in the range of 5-150 nm, the second layer has a thickness in the range of 5-150 nm, and the tribological coating has an overall thickness in the range of 5-100 µm.

19. The piston ring set forth in claim 18 wherein the thickness of the first layer is different than that of the second layer.

\* \* \* \* \*